(12) United States Patent
Lien et al.

(10) Patent No.: US 6,205,049 B1
(45) Date of Patent: Mar. 20, 2001

(54) FIVE-TRANSISTOR SRAM CELL

(75) Inventors: Chuen-Der Lien, Los Altos Hills; Chau Chin Wu, Cupertino, both of CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 09/384,300

(22) Filed: Aug. 26, 1999

(51) Int. Cl.$^7$ .................................................. G11C 11/00
(52) U.S. Cl. ...................... 365/154; 365/156; 365/230.05
(58) Field of Search .................................. 365/154, 156, 365/230.05

(56) References Cited

U.S. PATENT DOCUMENTS

| | | |
|---|---|---|
| 4,724,530 | 2/1988 | Dingwall . |
| 4,750,155 | 6/1988 | Hsieh . |
| 4,821,233 | 4/1989 | Hsieh . |
| 5,148,390 | 9/1992 | Hsieh . |
| 5,298,816 * | 3/1994 | Kaplinsky ............................ 327/427 |
| 5,301,147 * | 4/1994 | Guo et al. ............................ 365/154 |
| 5,453,950 * | 9/1995 | Voss et al. .......................... 365/156 |
| 5,689,471 * | 11/1997 | Voss et al. .......................... 365/210 |

OTHER PUBLICATIONS

Craig Lage, James D. Hayden, Chitra Subramanian, "Advanced SRAM Technology—The Race Between 4T And 6T Cells," IEDM, pp. 271–274, (1996).

\* cited by examiner

*Primary Examiner*—David Nelms
*Assistant Examiner*—Gene N. Auduong
(74) *Attorney, Agent, or Firm*—Bever Hoffman & Harms, LLP

(57) ABSTRACT

A static random access memory (SRAM) system that includes a five-transistor SRAM cell and a cell voltage control circuit coupled to provide power to the SRAM cell. The cell voltage control circuit supplies the SRAM cell with the $V_{CC}$ supply voltage if the SRAM cell is not being written (i.e., during a read mode or a standby mode). If the SRAM cell is being written, the cell voltage control circuit supplies the SRAM cell with a cell voltage that is less than the $V_{CC}$ supply voltage. The lower cell voltage weakens pull-down transistors in the SRAM cell, thereby enabling logic high values to be written to the SRAM cell. In one embodiment, the cell voltage is less than the $V_{CC}$ supply voltage minus the threshold voltage of an access transistor of the SRAM cell. The cell voltage is high enough to enable the SRAM cell to reliably store data during a write disturb condition. A method of operating the five-transistor SRAM cell includes the steps of (1) powering the SRAM cell with a $V_{CC}$ supply voltage during a read mode, (2) powering the SRAM cell with the $V_{CC}$ supply voltage during a standby mode, and (3) powering the SRAM cell with a cell voltage less than the $V_{CC}$ supply voltage during a write mode.

20 Claims, 7 Drawing Sheets

FIVE-TRANSISTOR SRAM CELL

BACKGROUND OF THE INVENTION

1. Field of the Invention

The present invention relates to static random access memory (SRAM) cells. More specifically, the present invention relates to five transistor SRAM cells and methods for operating these cells in an array.

2. Discussion of Related Art

FIG. 1 is a circuit diagram of a conventional six-transistor SRAM cell 100. SRAM cell 100 includes n-channel access transistors 101–102, a first inverter 111 (which includes p-channel transistor 103 and n-channel transistor 104), a second inverter 112 (which includes p-channel transistor 105 and n-channel transistor 106), complementary bit lines 121–122, and word line 123. The operation of SRAM cell 100 is well documented in numerous resources, including, for example, Prince, Semiconductor Memories (2nd Edition, 1991), pp. 157–159. In general, SRAM cell 100 is accessed through both of access transistors 101–102 during read and write operations. Accessing SRAM cell 100 in this manner results in a relatively stable SRAM cell during both read and write operations. However, a relatively large layout area is required for the six transistors of SPAM cell 100. It would therefore be desirable to have an SRAM cell that requires fewer than six transistors, but has the same stability as a six-transistor SRAM cell.

FIG. 2 is a circuit diagram of a conventional five-transistor SRAM cell 200. As used herein, a five-transistor SRAM cell is defined as an SRAM cell that includes only five-transistors and no other circuit elements, such as diodes or resistors. SRAM cell 200 includes n-channel access transistor 201, inverters 211–212, nodes A and B, bit line 220 and word line 230. Inverter 211 includes p-channel transistor 203 and n-channel transistor 204. Similarly, inverter 212 includes p-channel transistor 205 and n-channel transistor 206.

To write a logical 1 to SRAM cell 200, the $V_{CC}$ supply voltage is applied to both bit line 220 and word line 230. Under these conditions, n-channel access transistor 201 is turned on, and a voltage equal to $V_{CC}-V_{TH}$ is applied to node A, where $V_{TH}$ is the threshold voltage of access transistor 201.

To write a logical 0 to SRAM cell 200, the $V_{CC}$ supply voltage is applied to word line 230, and the $V_{SS}$ supply voltage is applied to bit line 220. Under these conditions, n-channel access transistor 201 is turned on, and a voltage equal to the $V_{SS}$ supply voltage is applied to node A.

To read SRAM cell 200, the $V_{CC}$ supply voltage is applied to word line 230, and a read voltage is applied to bit line 220. This read voltage must not be so high as to write a logical 1 to SRAM cell 200 during the read operation. Similarly, this read voltage must not be so low as to write a logical 0 to SRAM cell 200. Normal temperature variations, voltage variations and process variations in SRAM cell 200 typically result in an inadequate margin for providing an appropriate read voltage in SRAM cell 200.

To compensate for the inadequate margin available for the read voltage, a boosted voltage has been applied to word line 230 during a write operation. This boosted voltage is greater than the $V_{CC}$ supply voltage. During a read operation, the $V_{CC}$ supply voltage is applied to word line 230. While this provides SRAM cell 200 with an acceptable operating margin, access transistor 201 must be fabricated with a relatively thick gate oxide in order to withstand the boosted voltage applied to word line 230. This thicker gate oxide undesirably increases the complexity of the process used to fabricate SRAM cell 200.

In addition, applying the boosted voltage to word line 230 necessarily results in write conditions in every SRAM cell coupled to word line 230. Thus, the number of SRAM cells coupled to word line 230 is limited by the byte width of the associated array. That is, if the byte width of an associated array is 8-bits, then only 8 SRAM cells can be coupled to word line 230. The resulting array is therefore much narrower than desired.

It would therefore be desirable to have a five-transistor SRAM cell that operates in a stable manner with a single voltage applied to the gate of the access transistor during both read and write operations. It would further be desirable to have a five-transistor SRAM cell that can be incorporated in an array, such that the number of SRAM cells coupled to each word line in the array is greater than the width of a byte in the array.

SUMMARY

Accordingly, the present invention provides an SRAM system that includes a five-transistor SRAM cell and a cell voltage control circuit coupled to provide power to the SRAM cell. The five-transistor SRAM cell includes an n-channel access transistor and a pair of cross-coupled inverters. The pair of cross-coupled inverters are formed by a pair of p-channel pull-up transistors and a pair of n-channel pull-down transistors that are stronger (i.e., have a greater width-to-length ratio) than the access transistor. As a result, it is relatively difficult to write a logic high value to the SRAM cell if the SRAM cell currently stores a logic low value. The cell voltage control circuit facilitates such a write operation by supplying the cross-coupled inverters with a cell voltage that is less than the $V_{CC}$ supply voltage during a write operation. In one embodiment, the cell voltage is selected to be less than the $V_{CC}$ supply voltage minus the threshold voltage of the access transistor. The cell voltage is further selected to be high enough to enable the SRAM cell to reliably store data during a write disturb condition. The lower cell voltage weakens the pull-down transistors in the SRAM cell, thereby enabling a logic high value to be easily written to the SRAM cell.

When the SRAM cell is not being written (i.e., during a read mode or a standby mode), the cell voltage control circuit supplies the cross-coupled inverters with the $V_{CC}$ supply voltage, thereby resulting in a stable SRAM cell.

The present invention further comprises methods of operating the five-transistor SRAM cell. One method includes the steps of (1) powering the SRAM cell with a $V_{CC}$ supply voltage during a read mode, (2) powering the SRAM cell with the $V_{CC}$ supply voltage during a standby mode, and (3) powering the SRAM cell with a cell voltage less than the $V_{CC}$ supply voltage during a write mode.

Another embodiment includes an SRAM system that includes an array of five-transistor SRAM cells arranged in rows and columns, and a plurality of cell voltage control circuits. Each of the cell voltage control circuits is coupled to supply power to a corresponding column of the SRAM cells. Each cell voltage control circuit provides the $V_{CC}$ supply voltage to power its corresponding column when no SRAM cells in the corresponding column are subject to a write operation. Each cell voltage control circuit further provides a cell voltage, which is less than the $V_{CC}$ supply voltage, to power its corresponding column when an SRAM cell in the column is subject to a write operation. The lower cell voltage facilitates write operations to the SRAM cells by weakening pull-down transistors in the SRAM cells during the write operation. Moreover, providing each column with a corresponding cell voltage control circuit enables the number of SRAM cells in each row to be greater than the byte-width of the array. In a variation of this embodiment, each cell voltage control circuit is coupled to supply power to a corresponding plurality of columns of SRAM cells. This advantageously reduces the required number of cell voltage control circuits.

In another embodiment, each of the cell voltage control circuits is coupled to supply power to a corresponding row of the SRAM cells. Each cell voltage control circuit provides the $V_{CC}$ supply voltage to power its corresponding row when no SRAM cells in the corresponding row are subject to a write operation. Each cell voltage control circuit further provides a cell voltage, which is less than the $V_{CC}$ supply voltage, to power its corresponding row when an SRAM cell in the row is subject to a write operation. Again, the lower cell voltage facilitates write operations to the SRAM cells by weakening pull-down transistors in the SRAM cells during the write operation. In a variation of this embodiment, each cell voltage control circuit is coupled to supply power to a corresponding plurality of rows of SRAM cells. This advantageously reduces the required number of cell voltage control circuits.

In another embodiment of the present invention, the polarities of the transistors are reversed (i.e., p-channel to n-channel and vice versa), as are the connections to the $V_{CC}$ and $V_{SS}$ supply voltage terminals. In this embodiment, the cell voltage control circuit is modified to provide the $V_{SS}$ supply voltage during standby and read operations, and a cell voltage, which is greater than or equal to the $V_{SS}$ supply voltage plus the threshold voltage of a p-channel access transistor, during write operations.

The present invention will be more fully understood in view of the following description and drawings.

DETAILED DESCRIPTION

Figure 1:
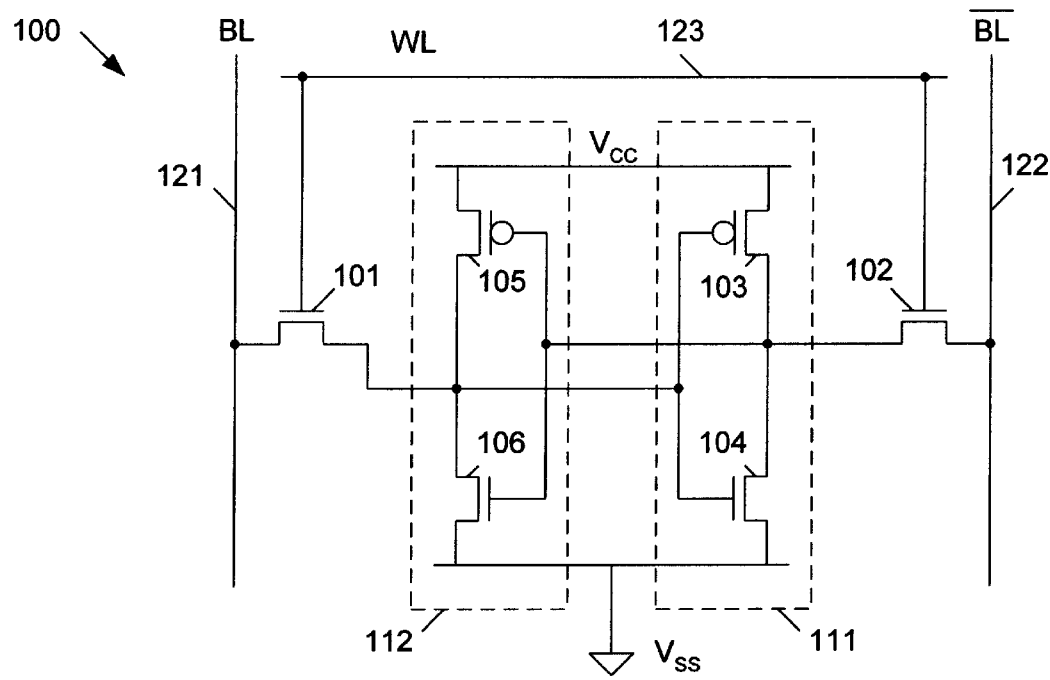
FIG. 1 is a circuit diagram of a conventional six-transistor SRAM cell.
Figure 2:
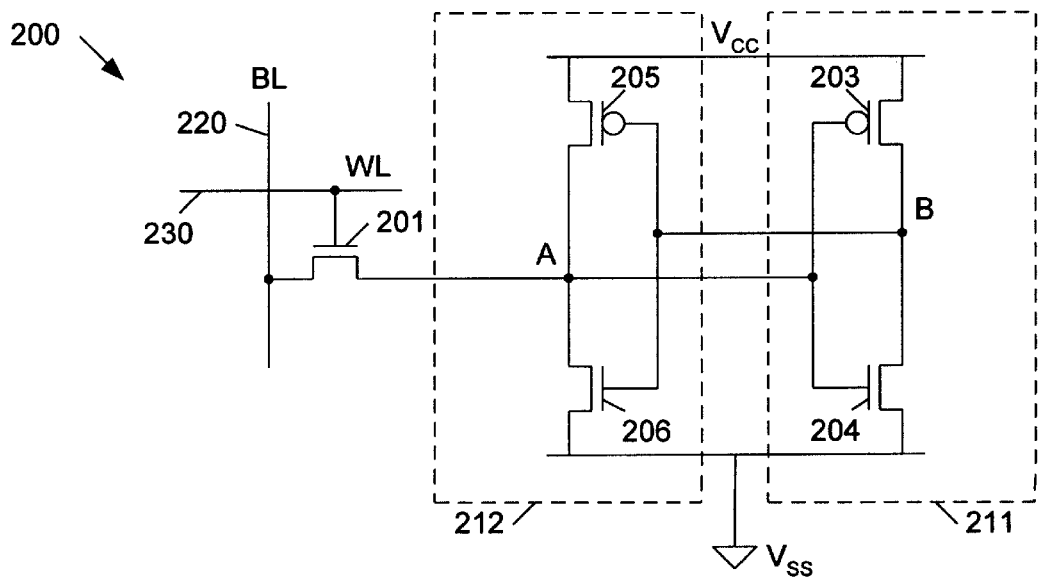
FIG. 2 is a circuit diagram of a conventional five-transistor SRAM cell.
Figure 3:
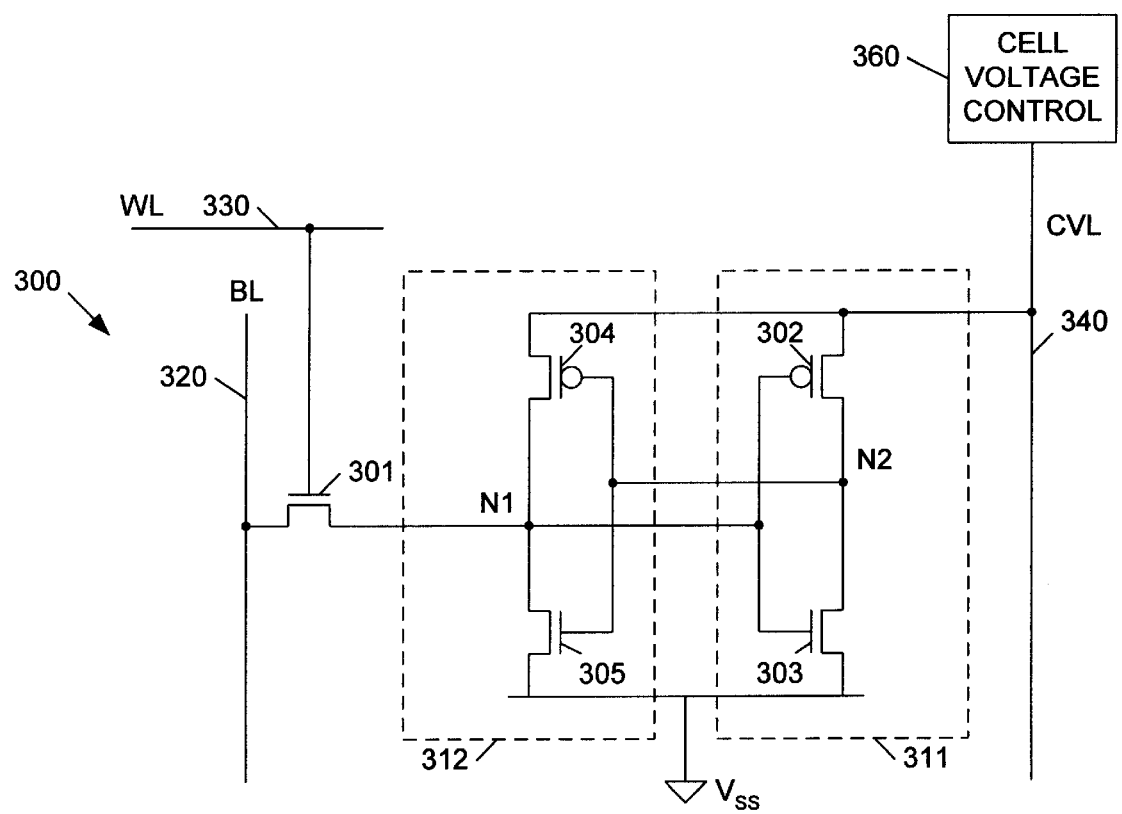
FIG. 3 is a circuit diagram of a five-transistor SRAM cell in accordance with one embodiment of the present invention.

FIG. 3 is a circuit diagram of a five-transistor SRAM cell 300 in accordance with one embodiment of the present invention. In the described embodiment, SRAM cell 300 is fabricated using a conventional 0.25 micron CMOS process. In other embodiments, SRAM cell 300 can be fabricated using other processes. In the described example, SRAM cell 300 is operated in response to a positive supply voltage ($V_{CC}$) having a nominal value of 2.5 Volts and a ground supply voltage ($V_{SS}$) of 0 Volts. Other supply voltages can be used in other embodiments.

SPAM cell 300 includes n-channel access transistor 301, inverters 311–312, nodes N1 and N2, bit line (BL) 320, word line (WL) 330 and cell voltage line (CVL) 340. A cell voltage control circuit 360 is coupled to cell voltage line 340. Inverter 311 includes p-channel pull-up transistor 302 and n-channel pull-down transistor 303, which are connected in series as illustrated between cell voltage line 340 and the $V_{SS}$ voltage supply terminal. Similarly, inverter 312 includes p-channel pull-up transistor 304 and n-channel pull-down transistor 305, which are connected in series as illustrated between cell voltage line 340 and the $V_{SS}$ voltage supply terminal. The gates of transistors 302 and 303 are commonly coupled to node N1, and the gates of transistors 304 and 305 are commonly coupled to node N2. As a result, inverters 311–312 are cross-coupled to form a storage latch.

Access transistor 301 has a drain coupled to bit line 320, a gate coupled to word line 330, and a source coupled to node N1. The width-to-length ratios of pull-down transistors 303 and 305 are selected to be greater than the width-to-length ratio of access transistor 301.

As described in more detail below, SRAM cell 300 can be programmed (i.e., written) to store a logic high value or a logic low value. As defined herein, SRAM cell 300 stores a logic high value when node N1 is held at the $V_{CC}$ supply voltage (2.5 Volts), and node N2 is held at the $V_{SS}$ supply voltage (0 Volts). To accomplish this, the $V_{CC}$ supply voltage is applied to cell voltage line 340. P-channel pull-up transistor 304 is turned on, thereby pulling up node N1, and n-channel pull-down transistor 303 is turned on, thereby pulling down node N2. Transistors 302 and 305 are turned off when SRAM cell 300 stores a logic high value.

Conversely, SRAM cell 300 stores a logic low value when node N1 is held at the $V_{SS}$ supply voltage (0 Volts), and node N2 is held at the $V_{CC}$ supply voltage. To accomplish this, the $V_{CC}$ supply voltage is applied to cell voltage line 340. P-channel pull-up transistor 302 is turned on, thereby pulling up node N2, and n-channel pull-down transistor 305 is turned on, thereby pulling down node N1. Transistors 303 and 304 are turned off when SRAM cell 300 stores a logic low value.

Figure 4:
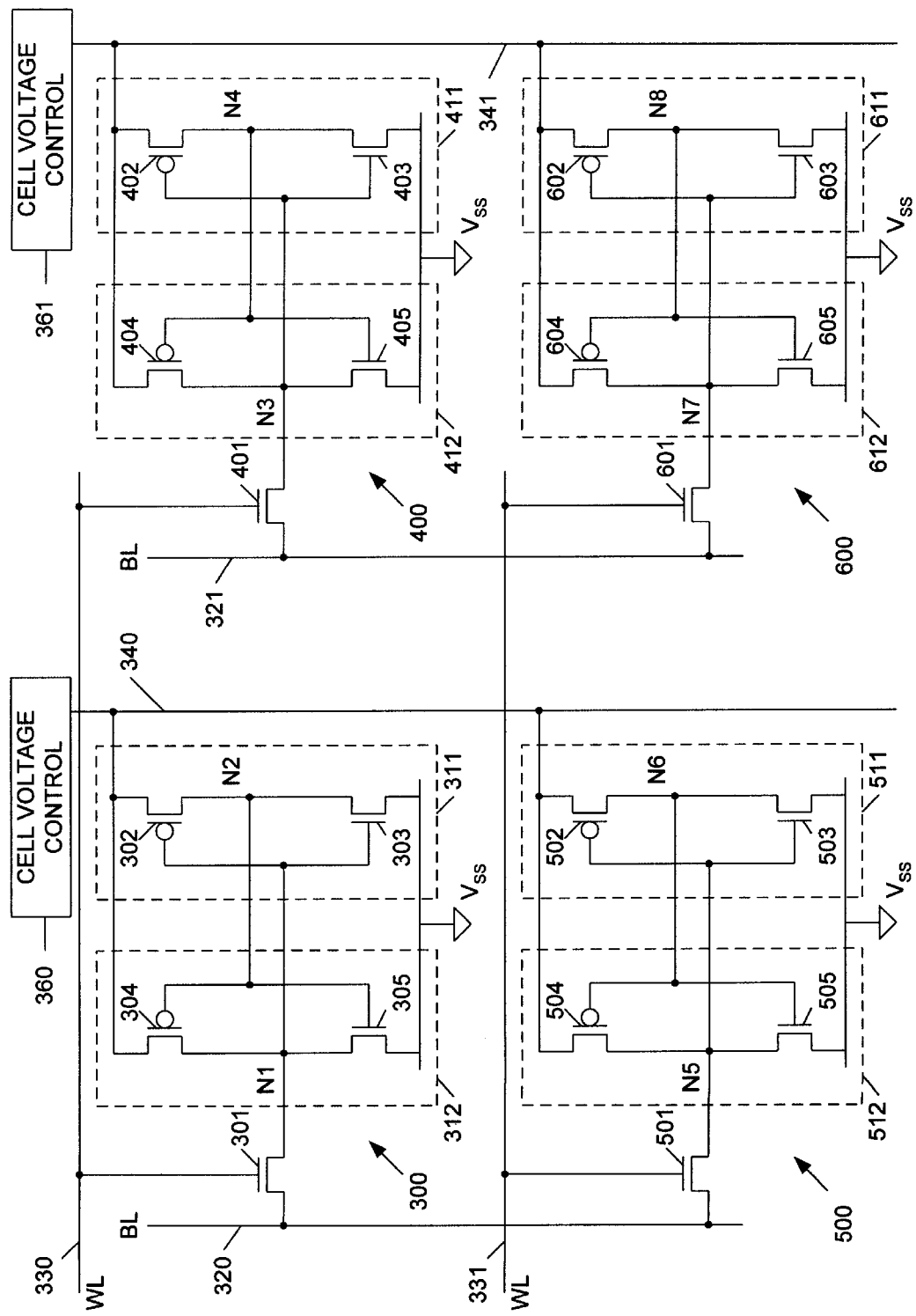
FIG. 4 is a circuit diagram of an array of five-transistor SRAM cells in accordance with one embodiment of the present invention.

FIG. 4 is a circuit diagram of a 2×2 array of five-transistor SRAM cells 300, 400, 500, and 600. Although a 2×2 array is described, this array can easily be expanded to have other dimensions in view of the following description. SRAM cells 400, 500 and 600 are identical to SRAM cell 300 (FIG. 3). SRAM cell 400, includes access transistor 401, transistors 402–405 (which form inverters 411 and 412) and nodes N3 and N4. Similarly, SRAM cell 500 includes access transistor 501, transistors 502–505 (which form inverters 511 and 512) and nodes N5 and N6. SRAM cell 600 includes access transistor 601, transistors 602–605 (which form inverters 611 and 612) and nodes N7 and N8.

SRAM cells 300 and 400 are located in a first row of the array. The gates of access transistors 301 and 401 are commonly connected to a first word line 330.

SRAM cells 500 and 600 are located in a second row of the array. The gates of access transistors 501 and 601 are commonly connected to a second word line 331. Word lines 330 and 331 extend along a horizontal axis of the array.

SRAM cells 300 and 500 are located in a first column of the array. Within this first column, the drains of access transistors 301 and 501 are commonly connected to a first bit line 320. Also within this first column, the sources of p-channel pull-up transistors 302, 304, 502 and 504 are commonly connected to a first cell voltage line 340. Bit line 320 and cell voltage line 340 both extend along a vertical axis of the array. Cell voltage line 340 is coupled to a cell voltage control circuit 360.

SRAM cells 400 and 600 are located in a second column of the array. Within this second column, the drains of access transistors 401 and 601 are commonly connected to a second bit line 321. Also within this second column, the sources of p-channel pull-up transistors 402, 404, 602 and 604 are commonly connected to a second cell voltage line 341. Bit line 321 and cell voltage line 341 both extend along a vertical axis of the array. Cell voltage line 341 is coupled to a cell voltage control circuit 361.

The 2×2 array of FIG. 4 operates as follows in accordance with one embodiment of the present invention. Table 1 summarizes the operating conditions present during a standby mode, during a read of SRAM cells 300 and 400, and during write operations to SRAM cell 300.

TABLE 1

| Mode | WL 330 | WL 331 | BL 320 | BL 321 | CVL 340 | CVL 341 |
|---|---|---|---|---|---|---|
| Standby | $V_{SS}$ | $V_{SS}$ | $V_{CC}$ | $V_{CC}$ | $V_{CC}$ | $V_{CC}$ |
| Read Cells 300 and 400 | $V_{CC}$ | $V_{SS}$ | $V_{CC}$ | $V_{CC}$ | $V_{CC}$ | $V_{CC}$ |
| Write high to Cell 300 | $V_{CC}$ | $V_{SS}$ | $V_{CC}$ | $V_{CC}$ | $V_{PS}$ | $V_{CC}$ |
| Write low to Cell 300 | $V_{CC}$ | $V_{SS}$ | $V_{SS}$ | $V_{CC}$ | $V_{CC}$ or $V_{PS}$ | $V_{CC}$ |

Standby Mode

The standby mode exists when none of SRAM cells 300, 400, 500 and 600 is subject to a read condition or a write condition. In the standby mode, word lines 330–331 are held at a logic low voltage (i.e., the $V_{SS}$ supply voltage of 0 Volts). As a result, access transistors 301, 401, 501 and 601 are turned off, thereby isolating the SRAM cells 300, 400, 500 and 600 from bit lines 320–321. In the described embodiment, bit lines 320–321 are held at a logic high voltage (i.e., the $V_{CC}$ supply voltage of 2.5 Volts). Maintaining bit lines 320–321 at a logic high voltage during standby advantageously reduces the voltage swing on these bit lines if the next operation is a read operation. In another embodiment, bit lines 320–321 can be maintained in either a high state or a low state. That is, bit lines 320–321 can have a "don't care" state.

In the standby mode, cell voltage control circuits 360–361 maintain cell voltage lines 340–341 at the $V_{CC}$ supply voltage (i.e., 2.5 Volts). As a result, cross-coupled inverter pairs 311–312, 411–412, 511–512 and 611–612 are powered by the full $V_{CC}$ supply voltage. Under these conditions, each of these cross-coupled inverter pairs pulls up one of its internal nodes (e.g., node N1 or node N2) to a high voltage equal to the $V_{CC}$ supply voltage. The particular node pulled up to the $V_{CC}$ supply voltage is determined by the last data value written to the SRAM cell. SRAM cells 300, 400, 500 and 600 are very stable when the $V_{CC}$ supply voltage is applied to cell voltage lines 340–341.

Read Mode

In the read mode, data values are read from one or more memory cells in a selected row. The read mode is described below in connection with the reading of SRAM cells 300 and 400. In the read mode, cell voltage control circuits 360–361 apply the $V_{CC}$ supply voltage to cell voltage lines 340–341. As a result, SRAM cells 300, 400, 500 and 600 maintain their last written data values in a stable manner. Bit lines 320 and 321 are pre-charged to the $V_{CC}$ supply voltage. To read SRAM cells 300 and 400, the $V_{CC}$ supply voltage is applied to word line 330, thereby turning on access transistors 301 and 401. The $V_{SS}$ supply voltage is applied to word line 331, thereby turning off access transistors 501 and 601. As a result, SRAM cells 500 and 600 are isolated from bit lines 320 and 321, respectively, and do not interfere with the read operation.

If SRAM cell 300 stores a logic high value (i.e., node N1 is pulled up to the $V_{CC}$ supply voltage through pull-up transistor 304), then the voltage on bit line 320 remains at the $V_{CC}$ supply voltage. Conversely, if SRAM cell 300 stores a logic low value (i.e., node N1 is pulled down to the $V_{SS}$ supply voltage through pull-down transistor 305), then the voltage on bit line 320 is pulled down to a voltage less than the $V_{CC}$ supply voltage. A sense amplifier circuit (not shown) coupled to bit line 320 senses the voltage on bit line 320 to determine the state of the data value stored in SRAM cell 300. The data value stored in SRAM cell 400 is sensed in the same manner.

Write Mode

The write mode is described in connection with a write operation to SRAM cell 300. In general, a data value is written to SRAM cell 300 by applying the $V_{CC}$ supply voltage to word line 330, thereby turning on access transistor 301. A voltage representative of the logic value to be written to SRAM cell 300 is applied to bit line 320. For example, to write a logic high value to SRAM cell, the $V_{CC}$ supply voltage is applied to bit line 320. Similarly, to write a logic low value to SRAM cell 300, the $V_{SS}$ supply voltage is applied to bit line 320.

It is difficult to write a logic high value to SRAM cell 300 if SRAM cell 300 currently stores a logic low value. When SRAM cell 300 stores a logic low value, n-channel pull-down transistor 305 is turned on, thereby pulling down node N1 to the $V_{SS}$ supply voltage. While attempting to write a logic high value to SRAM cell 300, n-channel pull-down transistor 305 (which pulls down on node N1) contends with access transistor 301 (which pulls up on node N1). However, as described above, pull-down transistor 305 is designed to be stronger than access transistor 301. In order to write a logic high state to SRAM cell 300, pull-down transistor 305 is therefore made weaker by lowering the voltage on cell voltage line 340 to a voltage $V_{PS}$, which is lower than the $V_{CC}$ supply voltage. In the described embodiment, the voltage $V_{PS}$ is less than or equal to the $V_{CC}$ supply voltage minus $V_{TH}$, where $V_{TH}$ is the threshold voltage of access transistor 301. Cell voltage control circuit 360 applies the $V_{PS}$ voltage to cell voltage line 340.

The lower $V_{PS}$ voltage on cell voltage line 340 weakens pull-down transistor 305 as follows. When SRAM cell 300 stores a logic low value, p-channel pull-up transistor 302 is turned on, thereby coupling node N2 to cell voltage line 340. The lower $V_{PS}$ voltage on cell voltage line 340 is therefore provided at node N2. Because node N2 is coupled to the gate of n-channel pull-down transistor 305, the lower $V_{PS}$ voltage on node N2 results in the weakening of n-channel pull-down transistor 305.

The $V_{PS}$ voltage is selected to make n-channel pull-down transistor 305 weaker than access transistor 301. When pull-down transistor 305 is sufficiently weakened, node N1 is pulled up (through access transistor 301) to a voltage greater than the trigger point of inverter 311. That is, the voltage on node N1 is allowed to become high enough to flip the state of SRAM cell 300. After the logic high value has been written to SRAM cell 300, cell voltage control circuit 360 raises the voltage on cell voltage line 340 to the $V_{CC}$ supply voltage.

It is relatively easy to write a logic low value to SRAM cell 300. To write a logic low value to SRAM cell 300, word line 330 is held at a logic high voltage ($V_{CC}$), thereby turning on access transistor 301. Bit line 320 is held at a logic low voltage ($V_{SS}$), and cell voltage control circuit 360 holds cell voltage line 340 at a voltage of either $V_{CC}$ or $V_{PS}$. Under these conditions, node N1 is pulled down to the $V_{SS}$ supply voltage through access transistor 401, thereby turning on p-channel pull-up transistor 302. As a result, node N2 is pulled up to the voltage on cell voltage line 340 (i.e., $V_{CC}$ or $V_{PS}$), thereby turning on n-channel pull-down transistor 305. In this manner, a logic low value is stored in SRAM cell 300.

In the described example, SRAM cell 400 is not written. Rather, SRAM cell 400 retains a current stored data value. To accomplish this, bit line 321 and cell voltage line 341 are both held at the $V_{CC}$ supply voltage. Under these conditions, access transistor 401 is turned on, thereby coupling node N3 to bit line 321.

If SRAM cell 400 stores a logic low value, node N3 remains pulled down through n-channel pull-down transistor 405, even though access transistor 401 attempts to pull up node N3. This is because cell voltage control circuit 361 holds the voltage on cell voltage line 341 at the $V_{CC}$ supply voltage, thereby causing pull-down transistor 405 to remain stronger than access transistor 401.

If SRAM cell 400 stores a logic high value, node N3 is initially pulled up to the $V_{CC}$ supply voltage by p-channel pull-up transistor 404. Because turned on access transistor 401 tends to pull the voltage on node N3 up to the $V_{CC}$ supply voltage, there is no contention between pull-up transistor 404 and access transistor 401. As a result, the logic high value remains stored in SRAM cell 400.

During the write operation to SRAM cell 300, SRAM cells 500 and 600 are not written. To prevent SRAM cells 500 and 600 from being written, word line 331 is maintained at a logic low voltage ($V_{SS}$), thereby turning off access transistors 501 and 601, and isolating SRAM cells 500 and 600 from bit lines 320 and 321. Under these conditions, SRAM cell 600 is maintained in the standby mode. Because SRAM cell 500 is coupled to cell voltage line 340, SRAM cell 500 is supplied by the $V_{PS}$ voltage. As described above, the $V_{PS}$ voltage must be sufficiently low to allow a logic high value to be written to SRAM cell 300. However, the $V_{PS}$ voltage must also be sufficiently high to enable SRAM cell 500 to reliably store data. In the described embodiment, the $V_{PS}$ voltage is selected to be not lower than 0.5 Volts. Under these conditions, the data value stored by SRAM cell 500 is not disturbed.

In another embodiment, SRAM cell 400 can be written at the same time as SRAM cell 300. To accomplish this, cell voltage control circuit 361 lowers the voltage on cell voltage line 341 to the $V_{PS}$ voltage, and a voltage representative of the data value to be written to SRAM cell 400 is applied to bit line 321. SRAM cell 400 is thereby written in the same manner as SRAM cell 300.

Figure 5:
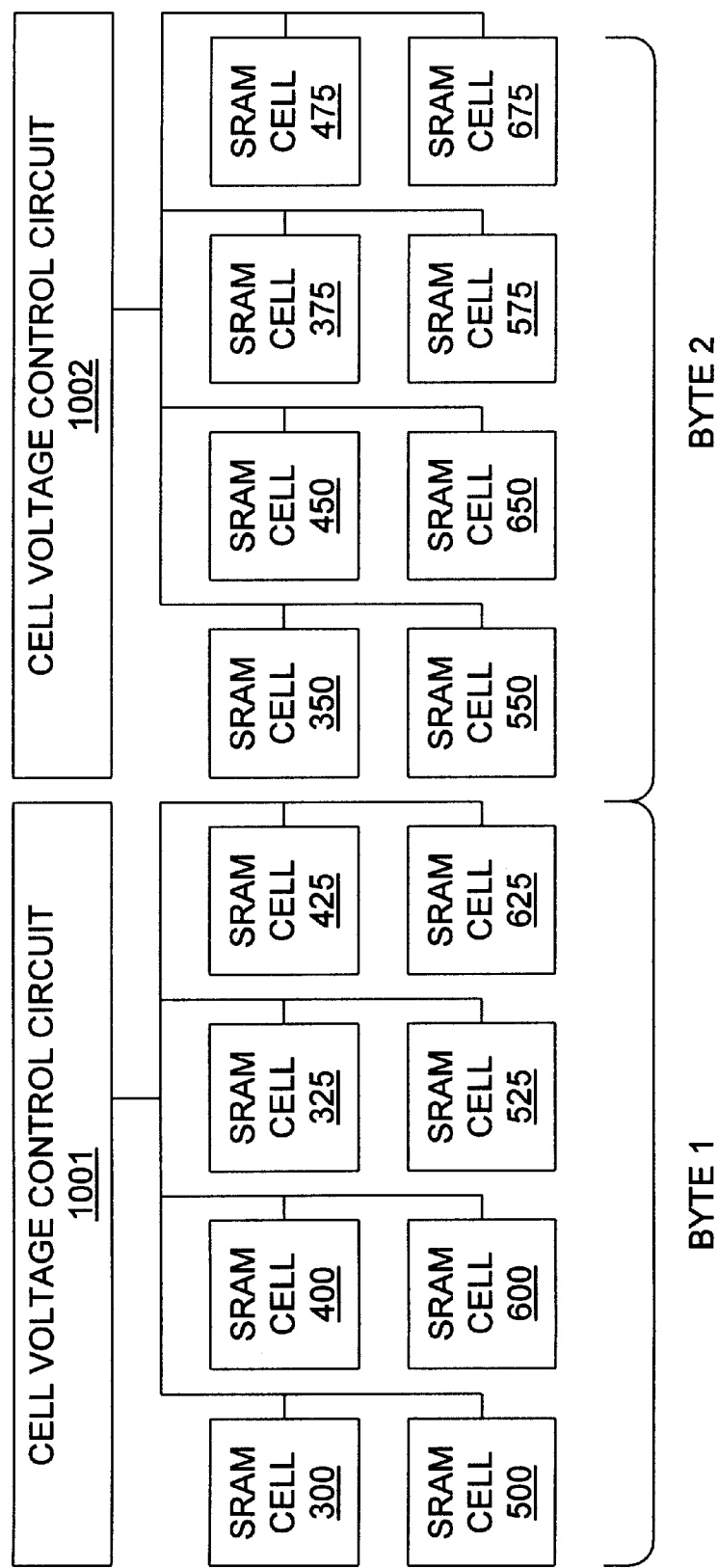
FIG. 5 is a circuit diagram of a 2×8 array of five-transistor SRAM cells in accordance with another embodiment of the present invention.

FIG. 5 is a block diagram illustrating a variation of the embodiment of FIG. 4. This embodiment has a 2×8 array that includes sixteen identical SRAM cells 300, 325, 350, 375, 400, 425, 450, 475, 500, 525, 550, 575, 600, 625, 650 and 675. SRAM cells 300, 400, 500 and 600 have been described above. In this embodiment, the first group of four columns in each row of the array stores one 4-bit byte of data. Thus, SRAM cells 300, 400, 325 and 425 each store one bit of a first 4-bit byte, and SRAM cells 500, 600, 525 and 625 each store one bit of a second 4-bit byte. Similarly, the second group of four columns in each row of the array stores a 4-bit byte of data. Thus, SRAM cells 350, 450, 375 and 475 each store one bit of a third 4-bit byte, and SRAM cells 550, 650, 575 and 675 each store one bit of a fourth 4-bit byte. The columns that store bits for the same byte are supplied by a single cell voltage control circuit. For example, the SRAM cells in the first group of four columns (i.e., SRAM cells 300, 400, 325, 425, 500, 600, 525 and 625) are supplied by cell voltage control circuit 1001. Similarly, the SRAM cells in the second group of four columns (i.e., SRAM cells 350, 450, 375, 475, 550, 650, 575 and 675) are supplied by cell voltage control circuit 1002. This embodiment advantageously reduces the required number of cell voltage control circuits for the array. In general, multiple columns of SRAM cells can share the same cell voltage control circuit, as long as the sharing columns all store bits of the same byte. This is because columns that store bits of the same byte are all subjected to the same voltages during read, write and standby conditions.

Figure 6:
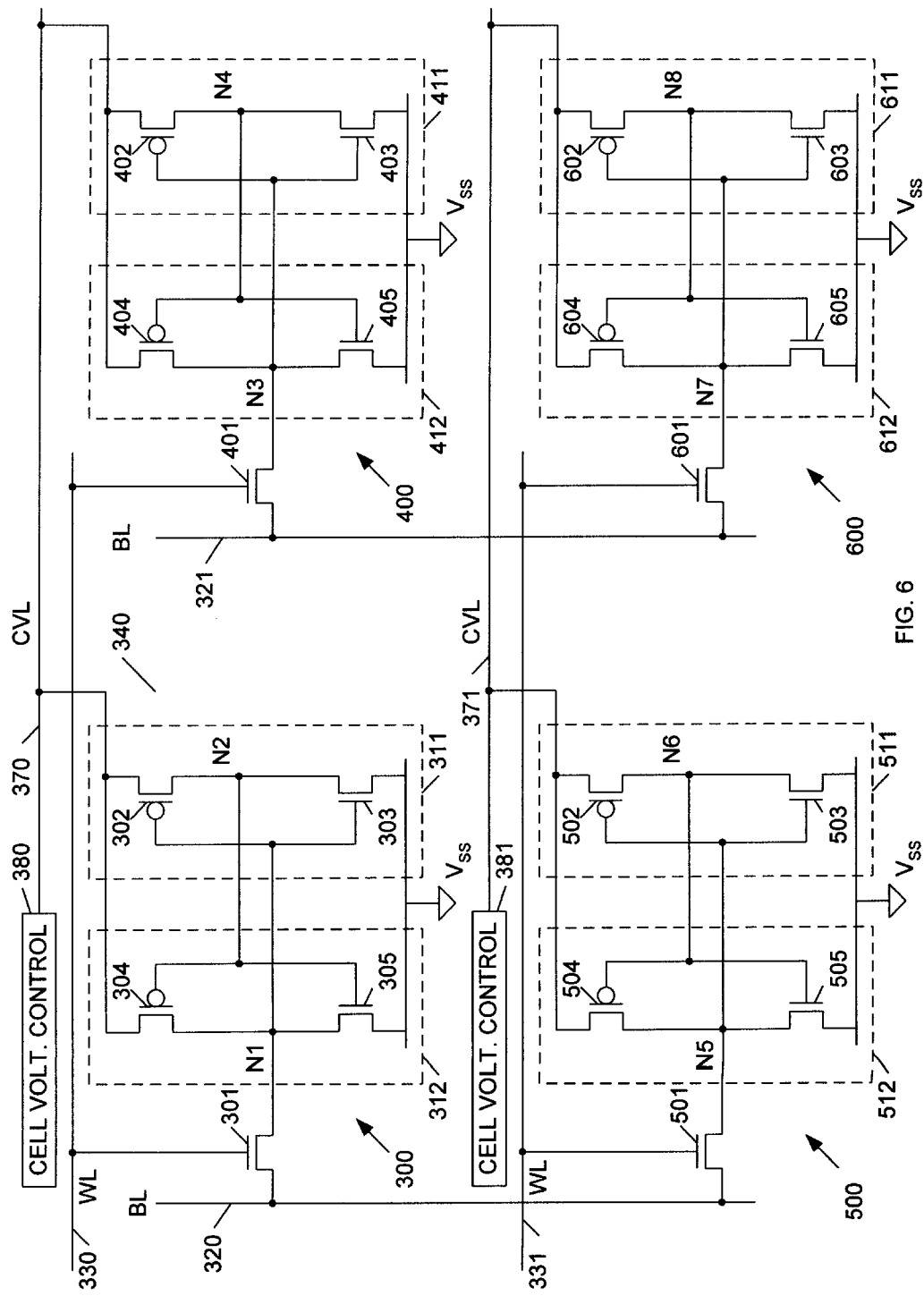
FIG. 6 is a circuit diagram of an array of five-transistor SRAM cells in accordance with another embodiment of the present invention.

FIG. 6 is a circuit diagram of a 2×2 array of SRAM cells in accordance with another embodiment of the present invention. The array of FIG. 6 includes SRAM cells 300, 400, 500 and 600, which are described above in connection with FIG. 4. However, the array of FIG. 6 replaces cell voltage lines 340–341, which are located vertically, with cell voltage lines 370–371, which are located horizontally. Cell voltage line 370, which extends along the first row of the array, is coupled to the sources of p-channel pull-up transistors 302, 304, 402 and 404. Similarly, cell voltage line 371, which extends along the second row of the array, is coupled to the sources of p-channel pull-up transistors 502, 504, 602 and 604. Cell voltage control circuits 380–381 are coupled to supply cell voltage lines 370–371, respectively. The embodiment of FIG. 6 is preferred if it is desired to simultaneously write data values to an entire row of SRAM cells. The array of FIG. 6 operates in a manner similar to the array of FIG. 4. Table 2 summarizes the operation of the array of FIG. 6. Write disturb conditions advantageously do not exist in rows that are not being written to, as the SRAM cells in the non-selected rows are not coupled to receive the $V_{PS}$ voltage.

TABLE 2

| Mode | WL 330 | WL 331 | BL 320 | BL 321 | CVL 370 | CVL 371 |
|---|---|---|---|---|---|---|
| Standby | $V_{SS}$ | $V_{SS}$ | $V_{CC}$ | $V_{CC}$ | $V_{CC}$ | $V_{CC}$ |
| Read Cells 300 and 400 | $V_{CC}$ | $V_{SS}$ | $V_{CC}$ | $V_{CC}$ | $V_{CC}$ | $V_{CC}$ |
| Write high to Cells 300,400 | $V_{CC}$ | $V_{SS}$ | $V_{CC}$ | $V_{CC}$ | $V_{PS}$ | $V_{CC}$ |
| Write low to Cells 300,400 | $V_{CC}$ | $V_{SS}$ | $V_{SS}$ | $V_{SS}$ | $V_{PS}$ | $V_{CC}$ |

Figure 7:
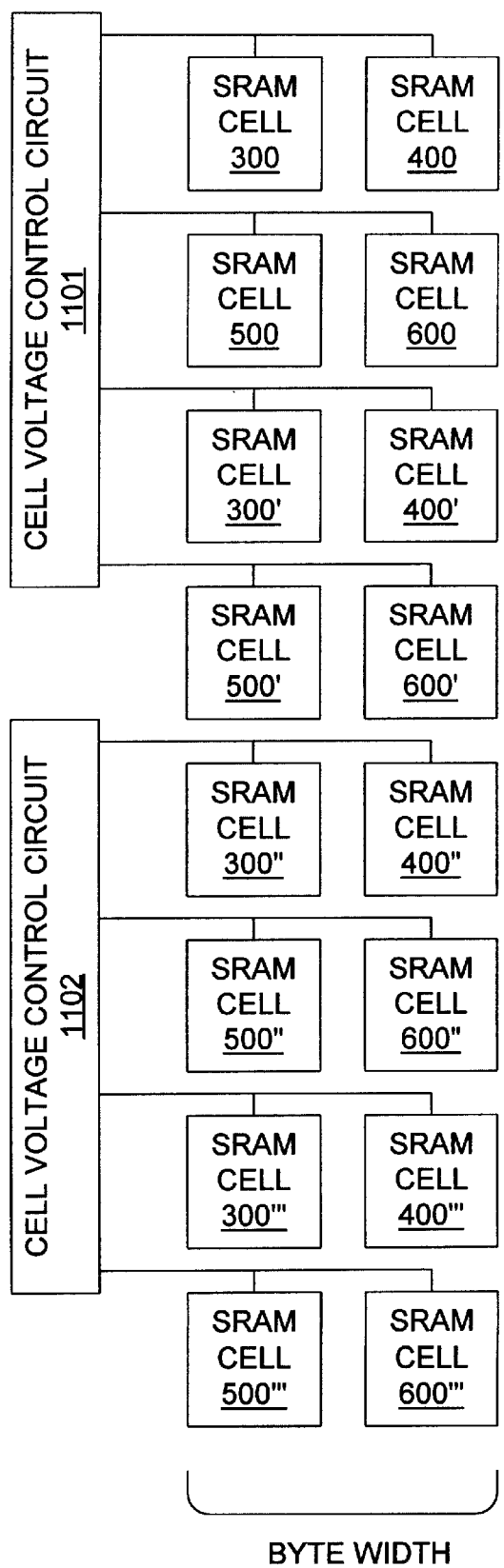
FIG. 7 is a circuit diagram of a 2×8 array of five-transistor SRAM cells in accordance with another embodiment of the present invention.

FIG. 7 is a block diagram illustrating a variation of the embodiment of FIG. 6. This embodiment has a 8×2 array that includes sixteen identical SRAM cells 300, 400, 500, 600, 300', 400', 500', 600', 300'', 400'', 500'', 600'', 300''', 400''', 500''' and 600'''. Five-transistor SRAM cells 300, 400, 500 and 600 have been described above in connection with FIG. 4. In this embodiment, multiple rows of SRAM cells are connected to the same cell voltage control circuit. For example, the first four rows of cells are coupled to cell voltage control circuit 1101, and the second four rows of cells are coupled to cell voltage control circuit 1102. This embodiment advantageously reduces the required number of cell voltage control circuits for the array. In general, multiple rows of SRAM cells can share the same cell voltage control circuit, as long as each of the sharing rows stores all the bits of a corresponding byte.

Figure 8:
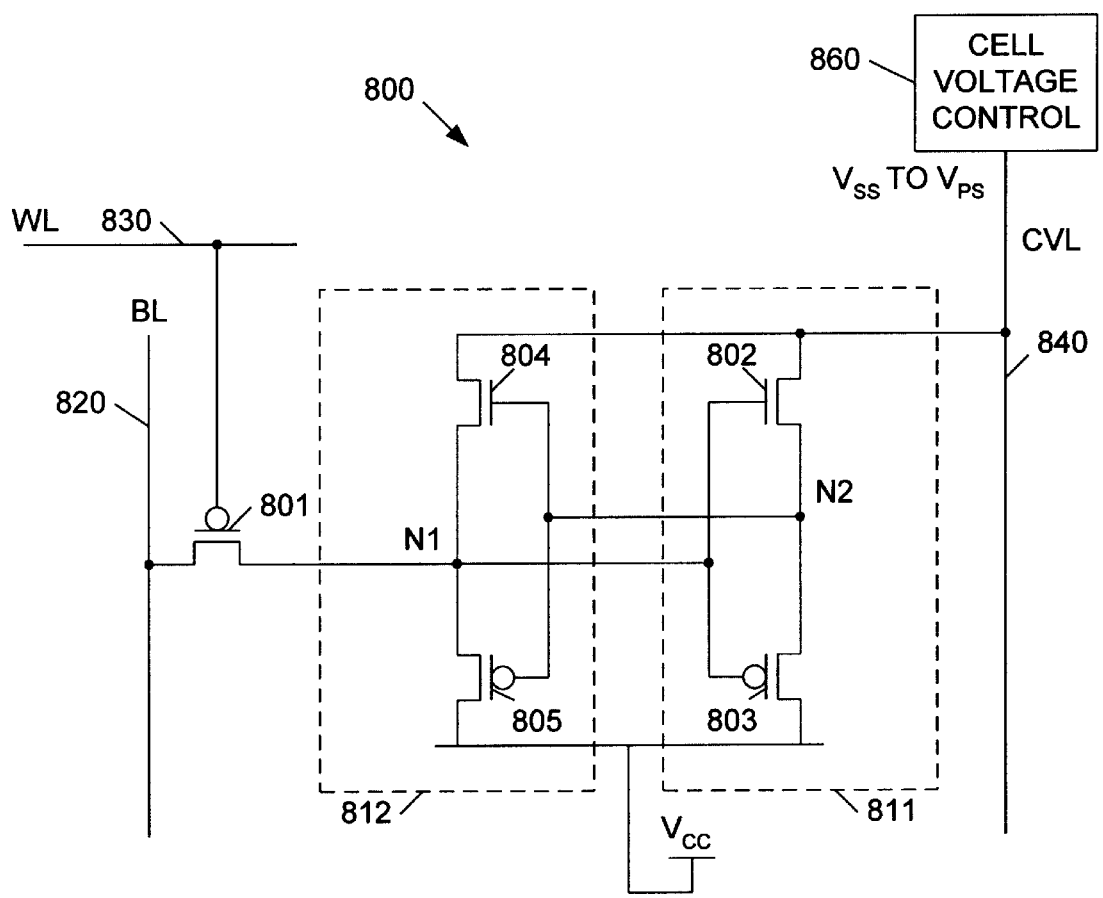
FIG. 8 is a circuit diagram of a five-transistor SRAM cell in accordance with another embodiment of the present invention.

FIG. 8 is a circuit diagram of a five-transistor SRAM cell 800 in accordance with another embodiment of the present invention. In this embodiment, the p-channel transistors of SRAM cell 300 are replaced with n-channel transistors, the n-channel transistors of SRAM cell 300 are replaced with p-channel transistors, and the $V_{SS}$ and $V_{CC}$ connections are switched. Thus, SRAM cell 800 includes p-channel access transistor 801, inverter 811 (n-channel pull-down transistor 802 and p-channel pull-up transistor 803), inverter 812 (n-channel pull-down transistor 804 and p-channel pull-up transistor 805), bit line 820, word line 830, cell voltage line 840 and cell voltage control circuit 860. Cell voltage control circuit 840 provides the $V_{SS}$ supply voltage (i.e., 0 Volts) during standby and read operations, and a programming voltage $V_{PS}$ during write operations. In one embodiment, the programming voltage $V_{PS}$ is greater than or equal to the $V_{SS}$ supply voltage plus the threshold voltage of p-channel access transistor 801. SRAM cell 800 can be coupled in various arrays in the manner described above for SRAM cell 300.

Although the present invention has been described in connection with several embodiments, it is understood that this invention is not limited to the embodiments disclosed, but is capable of various modifications which would be apparent to one of ordinary skill in the art. Thus, the invention is limited only by the following claims.

What is claimed is:

1. A static random access memory (SRAM) system comprising:

a five-transistor SRAM cell including an access transistor and a pair of pull-down transistors, wherein the pull-down transistors have a width-to-length ratio greater than a width-to-length ratio of the access transistor; and a cell voltage control circuit coupled to power the five-transistor SRAM cell, wherein the cell voltage control circuit is configured to power the five-transistor SRAM cell with a positive supply voltage during a read mode and during a standby mode, the cell voltage control circuit further being configured to power the five-transistor SRAM cell with a cell voltage less than the positive supply voltage during a write operation.

2. The SRAM system of claim 1, wherein the cell voltage is less than the positive supply voltage minus a threshold voltage of a transistor of the five-transistor SRAM cell.

3. The SRAM system of claim 1, wherein the cell voltage is high enough to enable the five-transistor SRAM cell to reliably store a data value during a write disturb condition.

4. The SRAM system of claim 1, wherein the cell voltage is greater than 0.5 Volts.

5. The SRAM system of claim 1, wherein the five-transistor SRAM cell comprises:

an n-channel access transistor;

a first inverter having an input terminal connected to a source of the n-channel access transistor; and a second inverter having an input terminal connected to an output terminal of the first inverter, and an output terminal coupled to the source of the n-channel access transistor and the input terminal of the first inverter, wherein the first inverter and the second inverter are coupled to the cell voltage control circuit.

6. The SRAM system of claim 5, wherein the first inverter comprises:

a first p-channel pull-up transistor having a source coupled to the cell voltage control circuit; and a first n-channel pull-down transistor having a drain coupled to a drain of the first pull-up transistor, a gate coupled to a gate of the first p-channel pull-up transistor, and a source coupled to a ground supply voltage terminal.

7. The SRAM system of claim 6, wherein the second inverter comprises:

a second p-channel pull-up transistor having a source coupled to the cell voltage control circuit; and a second n-channel pull-down transistor having a drain coupled to a drain of the second pull-up transistor and the gates of the first p-channel pull up transistor and the first n-channel pull-down transistor, a gate coupled to a gate of the second p-channel pull-up transistor and the drains of the first p-channel pull up transistor and the first n-channel pull-down transistor, and a source coupled to a ground supply voltage terminal.

8. A static random access memory (SRAM) system comprising:

an array of five-transistor SRAM cells arranged in a plurality of rows and columns, each of the five-transistor SRAM cells including an access transistor and a pair of pull-down transistors, wherein the pull-down transistors have a width-to-length ratio greater than a width-to-length ratio of the access transistor; and a plurality of cell voltage control circuits, each being coupled to power a corresponding column of five-transistor SRAM cells, wherein each of the cell voltage control circuits is configured to provide a positive supply voltage to power its corresponding column when no SRAM cells in the corresponding column are subject to a write operation, and wherein each of the cell voltage control circuits is configured to provide a cell voltage, which is less than the positive supply voltage, to power its corresponding column when an SRAM cell in the corresponding column is subject to a write operation.

9. The SRAM system of claim 8, wherein each of the cell voltage control circuits is coupled to power a corresponding plurality of columns of five-transistor SRAM cells, wherein each of the cell voltage control circuits is configured to provide the positive supply voltage to power its corresponding columns when no SRAM cells in the corresponding columns are subject to a write operation, and wherein each of the cell voltage control circuits is configured to provide the cell voltage to power its corresponding columns when SRAM cells in the corresponding columns are subject to a write operation.

10. A static random access memory (SRAM) system comprising:

an array of five-transistor SRAM cells arranged in a plurality of rows and columns, each of the five-transistor SRAM cells including an access transistor and a pair of pull-down transistors, wherein the pull-down transistors have a width-to-length ratio greater than a width-to-length ratio of the access transistor; and a plurality of cell voltage control circuits, each being coupled to power a corresponding row of five-transistor SRAM cells, wherein each of the cell voltage control circuits is configured to provide a positive supply voltage to power its corresponding row when no SRAM cells in the corresponding row are subject to a write operation, and wherein each of the cell voltage control circuits is configured to provide a cell voltage, which is less than the positive supply voltage, to power its corresponding row when an SRAM cell in the corresponding row is subject to a write operation.

11. The SRAM system of claim 10, wherein each of the cell voltage control circuits is coupled to power a corresponding plurality of rows of five-transistor SRAM cells, wherein each of the cell voltage control circuits is configured to provide the positive supply voltage to power its corresponding plurality of rows when no SRAM cells in the corresponding row are subject to a write operation, and wherein each of the cell voltage control circuits is configured to provide the cell voltage to power its corresponding plurality of rows when SRAM cells in the corresponding rows are subject to a write operation.

12. A static random access memory (SRAM) system comprising:

a five-transistor SRAM cell, including an access transistor and a pair of pull-down transistors, wherein the pull-down transistors have a width-to-length ratio greater than a width-to-length ratio of the access transistor; and a cell voltage control circuit coupled to power the five-transistor SRAM cell, wherein the cell voltage control circuit is configured to power the five-transistor SRAM cell with a $V_{SS}$ supply voltage during a read mode and during a standby mode, the cell voltage control circuit further being configured to power the five-transistor SRAM cell with a cell voltage greater than the $V_{SS}$ supply voltage during a write operation.

13. The SRAM system of claim 12, wherein the cell voltage is greater than the $V_{SS}$ supply voltage plus a threshold voltage of a transistor of the five-transistor SRAM cell.

14. The SRAM system of claim 12, wherein the five-transistor SRAM cell comprises:

a p-channel access transistor;

a first inverter having an input terminal connected to a source of the p-channel access transistor; and a second inverter having an input terminal connected to an output terminal of the first inverter, and an output terminal coupled to the source of the p-channel access transistor and the input terminal of the first inverter, wherein the first inverter and the second inverter are coupled to the cell voltage control circuit.

15. The SRAM system of claim 14, wherein the first inverter comprises:

a first p-channel pull-up transistor having a source coupled to a positive supply voltage terminal; and a first n-channel pull-down transistor having a drain coupled to a drain of the first pull-up transistor, a gate coupled to a gate of the first p-channel pull-up transistor, and a source coupled to the cell voltage control circuit.

16. The SRAM system of claim 15, wherein the second inverter comprises:

a second p-channel pull-up transistor having a source coupled to the positive supply voltage terminal; and a second n-channel pull-down transistor having a drain coupled to a drain of the second pull-up transistor and the gates of the first p-channel pull up transistor and the first n-channel pull-down transistor, a gate coupled to a gate of the second p-channel pull-up transistor and the drains of the first p-channel pull up transistor and the first n-channel pull-down transistor, and a source coupled to the cell voltage control circuit.

17. A static random access memory (SRAM) system comprising:

an array of five-transistor SRAM cells arranged in a plurality of rows and columns, each of the five-transistor SRAM cells including an access transistor and a pair of pull-down transistors, wherein the pull-down transistors have a width-to-length ratio greater than a width-to-length ratio of the access transistor; and a plurality of cell voltage control circuits, each being coupled to power a corresponding column of five-transistor SRAM cells, wherein each of the cell voltage control circuits is configured to provide a $V_{SS}$ supply voltage to power its corresponding column when no SRAM cells in the corresponding column are subject to a write operation, and wherein each of the cell voltage control circuits is configured to provide a cell voltage, which is greater than the $V_{SS}$ supply voltage, to power its corresponding column when an SRAM cell in the corresponding column is subject to a write operation.

18. The SRAM system of claim 17, wherein each of the cell voltage control circuits is coupled to power a corresponding plurality of columns of five-transistor SRAM cells, wherein each of the cell voltage control circuits is configured to provide the $V_{SS}$ supply voltage to power its corresponding columns when no SRAM cells in the corresponding columns are subject to a write operation, and wherein each of the cell voltage control circuits is configured to provide the cell voltage to power its corresponding columns when SRAM cells in the corresponding columns are subject to a write operation.

19. A static random access memory (SRAM) system comprising:

an array of five-transistor SRAM cells arranged in a plurality of rows and columns, each of the five-transistor SRAM cells including an access transistor and a pair of pull-down transistors, wherein the pull-down transistors have a width-to-length ratio greater than a width-to-length ratio of the access transistor; and a plurality of cell voltage control circuits, each being coupled to power a corresponding row of five-transistor SRAM cells, wherein each of the cell voltage control circuits is configured to provide a $V_{SS}$ supply voltage to power its corresponding row when no SRAM cells in the corresponding row are subject to a write operation, and wherein each of the cell voltage control circuits is configured to provide a cell voltage, which is greater than the $V_{SS}$ supply voltage, to power its corresponding row when an SRAM cell in the corresponding row is subject to a write operation.

20. The SRAM system of claim 19, wherein each of the cell voltage control circuits is coupled to power a corresponding plurality of rows of five-transistor SRAM cells, wherein each of the cell voltage control circuits is configured to provide the $V_{SS}$ supply voltage to power its corresponding plurality of rows when no SRAM cells in the corresponding row are subject to a write operation, and wherein each of the cell voltage control circuits is configured to provide the cell voltage to power its corresponding plurality of rows when SRAM cells in the corresponding rows are subject to a write operation.

* * * * *